United States Patent [19]

Kato

[11] Patent Number: 4,971,444

[45] Date of Patent: Nov. 20, 1990

[54] METHOD AND APPARATUS FOR DETECTING THE POSITION OF AN OBJECT

[75] Inventor: Yuzo Kato, Yokohama, Japan

[73] Assignee: Canon Kabushiki Kaisha, Tokyo, Japan

[21] Appl. No.: 387,361

[22] Filed: Jul. 28, 1989

Related U.S. Application Data

[63] Continuation of Ser. No. 316,531, Feb. 27, 1989, abandoned, which is a continuation of Ser. No. 241,805, Sep. 7, 1988, abandoned, which is a continuation of Ser. No. 106,784, Oct. 13, 1987, abandoned.

[30] Foreign Application Priority Data

Oct. 17, 1986 [JP] Japan .................................. 61-245551
Oct. 17, 1986 [JP] Japan .................................. 61-245552
Oct. 22, 1986 [JP] Japan .................................. 61-249472

[51] Int. Cl.$^5$ .............................................. G01B 11/00
[52] U.S. Cl. .................................. 356/375; 250/491.1; 356/401
[58] Field of Search .................. 356/375, 400, 401; 250/548, 561, 557, 491.1

[56] References Cited

U.S. PATENT DOCUMENTS

| | | | |
|---|---|---|---|
| 4,219,719 | 8/1980 | Frosien et al. | 356/401 |
| 4,487,505 | 12/1984 | Nakano et al. | 356/400 |
| 4,515,481 | 5/1985 | Yamada et al. | 356/400 |
| 4,553,845 | 11/1985 | Kuroki et al. | 356/400 |
| 4,641,035 | 2/1987 | Suzuki et al. | 356/400 X |
| 4,679,942 | 7/1987 | Suwa et al. | 356/401 |
| 4,803,644 | 2/1989 | Frazier et al. | 250/491.1 |

FOREIGN PATENT DOCUMENTS 2326402 1/1974 Fed. Rep. of Germany .
3235247 4/1983 Fed. Rep. of Germany .
60-178628 12/1985 Japan .

Primary Examiner—F. L. Evans
Attorney, Agent, or Firm—Fitzpatrick, Cella, Harper & Scinto

[57] ABSTRACT

A method of detecting the position of an object with respect to a predetermined standard position, includes detecting a signal concerned wtih the object, subjecting the detected signal and a predetermined reference signal to correlation processing to form a correlation signal, and detecting the position of the object with respect to the predetermined standard position, in accordance with the formed correlation signal.

11 Claims, 15 Drawing Sheets

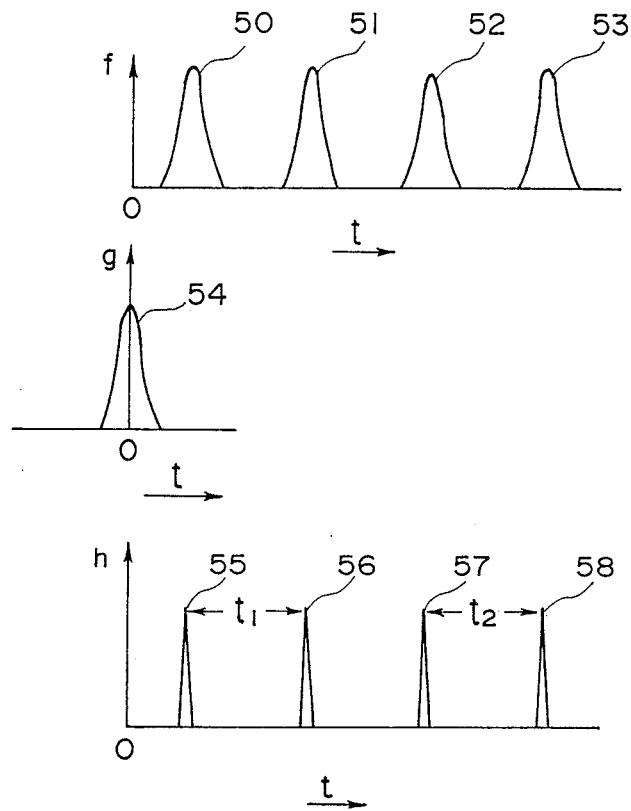
F I G. 8

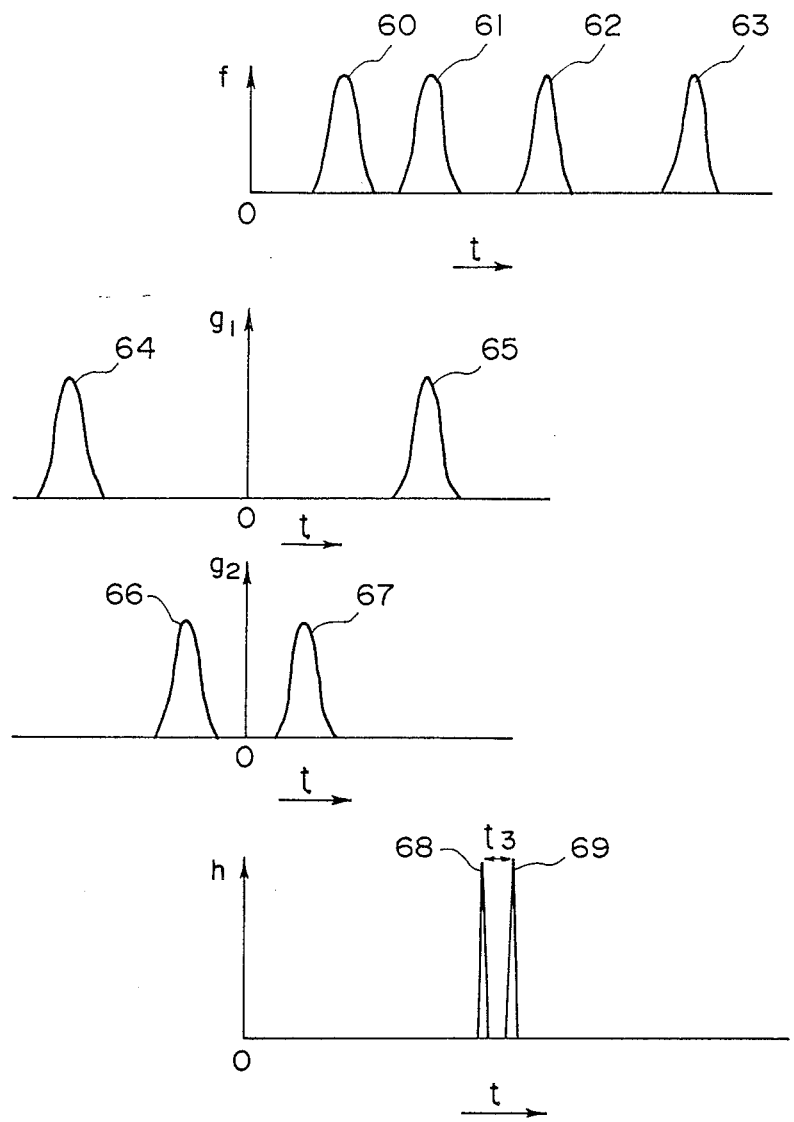
F I G. 9

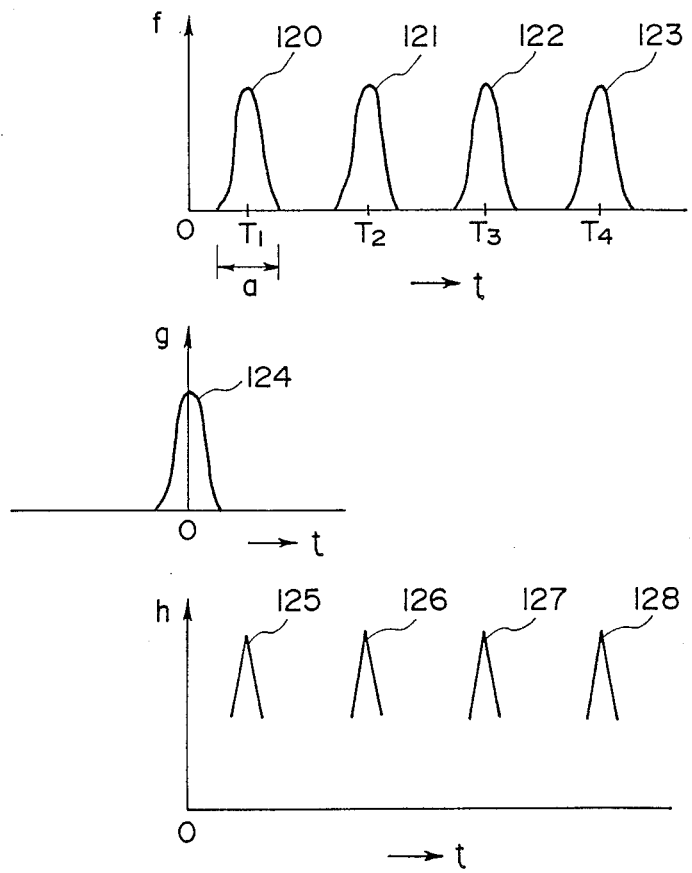
F I G. 12

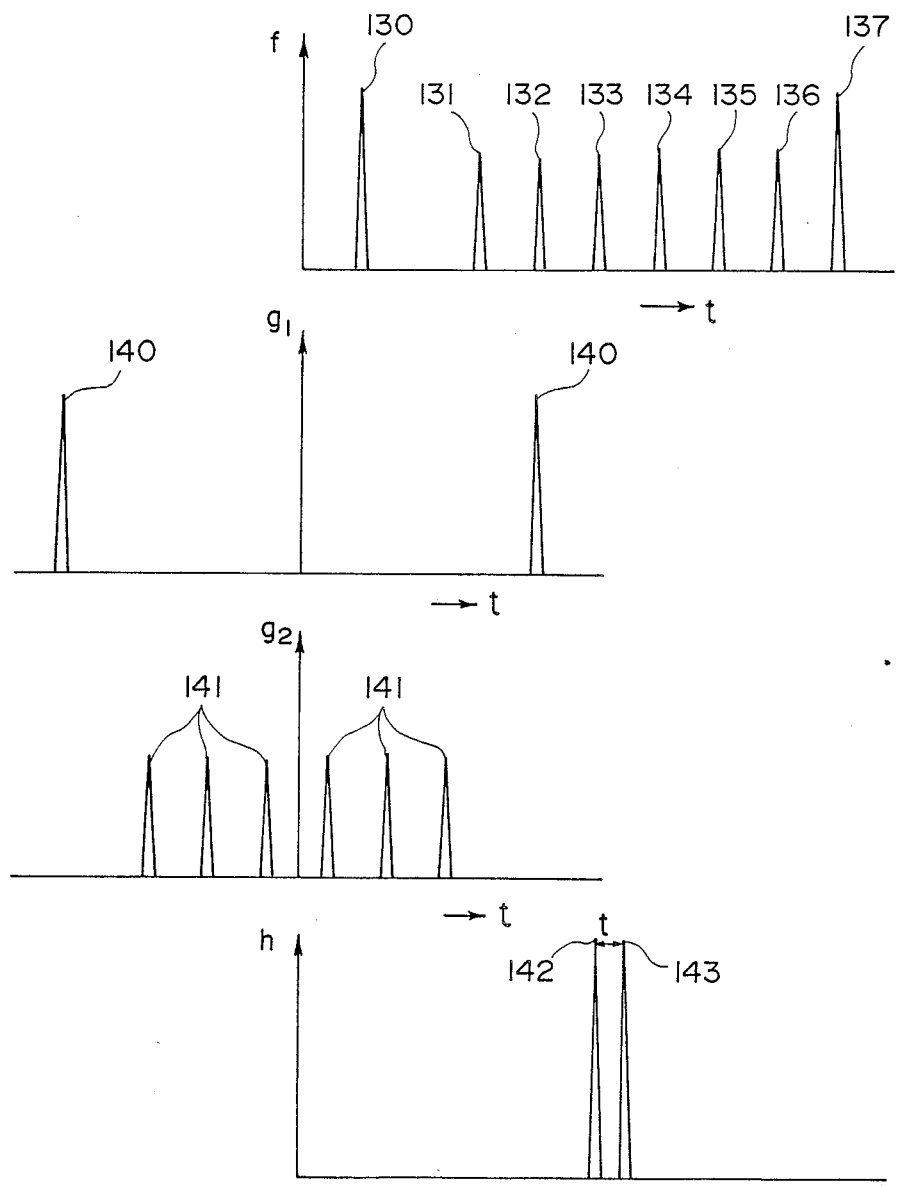
F I G. 14

METHOD AND APPARATUS FOR DETECTING THE POSITION OF AN OBJECT

This application is a continuation of application Ser. No. 07/316,531, filed Feb. 27, 1989 now abandoned, which is a continuation of application Ser. No. 07/241,805, filed Sept. 7, 1988 now abandoned, which was a continuation of application Ser. No. 07/106,784, filed Oct. 13, 1987 now abandoned.

FIELD OF THE INVENTION AND RELATED ART

This invention relates to a method and apparatus for detecting the position of an object and, more particularly, to a position detecting method and apparatus for detecting the position of an object with respect to a predetermined reference or standard. The position detecting method and apparatus of the present invention is usable, e.g., in semiconductor device manufacturing exposure apparatuses for detecting the positional relation between a reticle (mask) and a wafer. Particularly, the method and apparatus of the present invention is suitably usable to detect the position of an object where electric signals representing the position contain noise and/or distortion.

In the field of manufacture of semiconductor devices such as integrated circuit, optical exposure apparatuses called "stepper" or "mask aligner" and X-ray exposure apparatuses called "X-ray aligner" have been used. Usually, these apparatuses are provided with an arrangement for aligning a wafer with respect to a mask or reticle (hereinafter simply "mask"), prior to the initiation of the exposure of the wafer to a pattern formed on the mask.

To accomplish this mask-to-wafer alignment, usually alignment marks formed on the mask and the wafer and representing the positions of the mask and the wafer, respectively, are detected optically or by use of electron beams to thereby detect the positional relation between the mask and the wafer.

Typically, an alignment mark on the wafer is provided by a surface step (recess or protrusion) formed on the substrate of the wafer. For the transfer of the mask pattern onto the wafer by the "exposure", the wafer is coated with a radiation-sensitive material such as a photoresist material with a thickness on the order of a submicron to several microns. Accordingly, at the time of alignment, there exists a resist layer on the surface of the wafer with the surface including the wafer alignment mark. Namely, it is necessary to detect the wafer alignment mark by way of or with the intervention of the resist layer.

Various inconveniences are caused when a wafer mark is detected through the resist layer. For example, when light (particularly, a laser beam) is used, the light is reflected and refracted by the surface of the resist layer. Also, there occurs multireflection within the resist layer. Further, there occurs interference between the light reflected by the surface of the resist layer and the light reflected by the bottom of the resist layer (i.e. the surface of the wafer substrate). When an electron beam is used, it is scattered by the material of the resist layer. These phenomena caused as a result of the existence of the resist layer are commonly called "resist effect". Due to such resist effect, it is not easy to detect at high accuracy the positional relation between the mask and the wafer, which results in deteriorated alignment accuracy.

The problem will be described in more detail, in conjunction with a specific example.

FIG. 1 schematically shows alignment marks usable in an embodiment of the present invention, which will be described later, and an example of a signal waveform obtainable from these alignment marks. In FIG. 1, reference numerals 1–4 denote, respectively, mark elements of an alignment mark provided on a mask; reference numeral 5 denotes an alignment mark provided on a wafer; reference numeral 6 denotes the line of scan by a laser beam or an electron beam; reference numerals 7–10 denote, respectively, electric signals (pulse signals) which correspond to the points of intersection between the alignment marks and the scan line 6 defined as the scanning beam scans the marks and which signals are obtained by photoelectric conversion in a known manner; and reference numeral 11 denotes a slice level set for the binarization (binary-coding) of the pulse signals 7–10.

Positional deviation between the mask alignment mark and the wafer alignment mark of the FIG. 1 example may be detected in a known manner, such as follows:

For the detection of the positional relation between the mask and the wafer, the mask alignment mark comprising mark elements 1–4 and the wafer alignment mark 5 are scanned with a radiation beam such as a laser beam or an electron beam in each of two orthogonal direction(X and Y directions). When such a scanning radiation beam impinges upon the mark portion or mark element, light is scattered in the case of laser beam scanning, or reflected electrons and/or secondary electrons are produced in the case of electron beam scanning. By detecting such scattered light or reflected electrons and/or secondary electrons by use of a suitable detector, electric pulse signals such as illustrated at 7–10 in FIG. 1 are obtainable with respect to each of the two orthogonal scan directions (X and Y directions). Since these pulse signals are processed essentially in the same manner with regard to both of the two orthogonal scan directions, processing of the signal with regard to only one scan direction will be described, i.e. the X direction in the illustrated example.

In order to detect the positional deviation between the mask alignment mark and the wafer alignment mark of the FIG. 1 example, it is necessary to detect the spacing or interval between each of the mark elements 2 and 4 of the mask alignment mark and a mating portion of the wafer alignment mark (i.e. a left-hand or right-hand vertically extending portion of the mark 5 as viewed in FIG. 1). To achieve this, it is necessary to determine the center (central position) of each of the pulse signals 7–10. For this purpose, after the pulse signals 7–10 are obtained, they are binarized with a suitable slice level such as at 11 in FIG. 1, whereby electric signals of rectangular waveform are produced. Thereafter, the center of the width of each rectangular pulse is detected and, by this, the central position of each "unbinarized" pulse 7 8, 9 or 10 is determined.

When the interval between the center of the pulse signal 7 corresponding to the left-hand mark element 2 of the mask alignment mark and the center of the pulse signal 8 corresponding to the left-hand vertically extending portion of the wafer alignment mark 5 is denoted by t1, while the interval between the centers of similar right-hand pulse signals 9 and 10 are denoted by t2, the amount d of positional deviation between the mask alignment mark and the wafer alignment mark (on condition that they are aligned with each other when the wafer alignment mark 5 is positioned exactly at the midst of the mask alignment mark) can be given by the following equation:

$$d = (t1 - t2)/2 \qquad (1)$$

In order to ensure higher alignment accuracy, it is necessary to increase the accuracy of detecting the intervals between the pulse signals (representing the positional deviation between the marks) or, in other words, the positions of the centers of the pulse signals. In order that the center of each pulse signal is detected with improved accuracy, it is very desirable that the waveform of the pulse signal is symmetric with respect to the center of the pulse signal. Usually, the linewidth of each alignment mark as well as the spot diameter of the scanning laser beam or electron beam are determined to satisfy such desirable condition.

However, practically it is not easy to assure a symmetrical waveform of the pulse signal. As described hereinbefore, there exists a resist coating on an alignment mark formed on a wafer, with a thickness of on order of a submicron to several microns. Therefore, the alignment mark has to be detected by way of, through, or with the intervention of the resist layer. Thus, due to the resist effect described hereinbefore and/or as a result of unevenness in the thickness of the resist layer on the wafer surface, in many cases the pulse signal is distorted with the consequence that the symmetry of the signal waveform is destroyed. This is illustrated in FIG. 2. The distortion of the pulse signal easily causes an error in the detection of the center of the pulse signal which error directly leads to deteriorated alignment accuracy.

SUMMARY OF THE INVENTION

It is accordingly a primary object of the present invention to provide a position detecting method and apparatus by which the position of an object can be detected with high accuracy.

It is another object of the present invention to provide a position detecting method and apparatus by which high-speed and high-accuracy detection of the position of an object is made attainable.

In accordance with an aspect of the present invention, to achieve these objects, there is provided a position detecting method and apparatus wherein a signal corresponding to an object being examined is detected, while a reference signal is formed for the detection of the position of the object; wherein the detected signal corresponding to the object is subjected to correlation processing by use of the reference signal whereby a correlation signal is obtained; and wherein the center (central position) of the detected signal corresponding to the object is determined on the basis of the correlation signal, such that the position of the object with respect to a predetermined reference position is detected accordingly.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIG. 8 is a schematic representation for explicating the correlation processing performed on electric signals detected in the alignment system of the FIG. 6 example.

FIG. 9 is similar to FIG. 8 but shows another example of correlation processing performed on electric signals detected in the alignment system of the FIG. 6 example.

FIG. 12 is a schematic representation explicating the manner of correlation processing performed on electric signals detected in the alignment system of the FIG. 10 example.

FIG. 14 is a schematic representation explicating the manner of correlation processing performed on the electric signals obtained from the alignment marks of the FIG. 13 example.

DESCRIPTION OF THE PREFERRED EMBODIMENTS

Initially, the principle of the position detecting method of the present invention will now be described.

Figure 1:
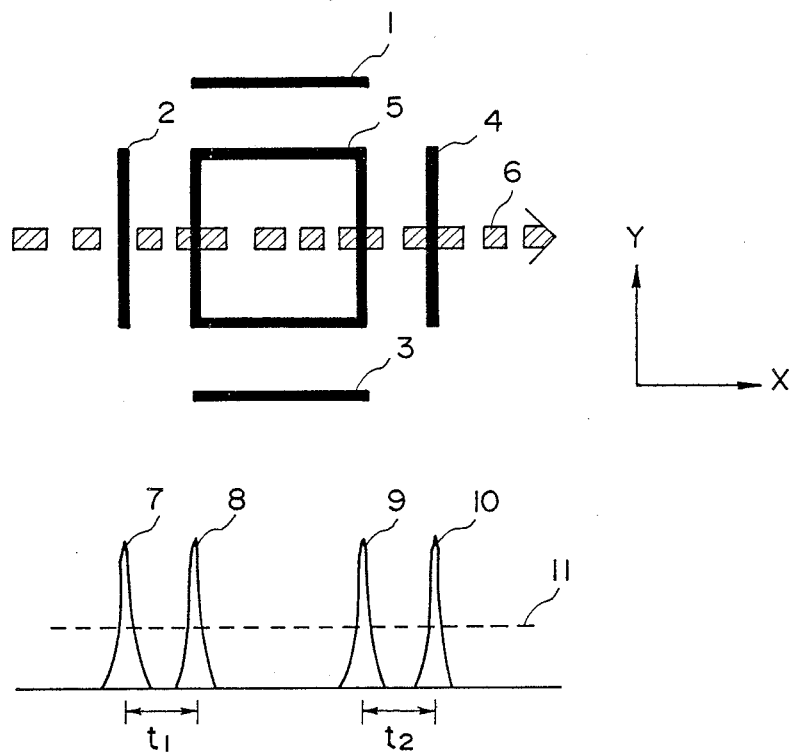
FIG. 1 is a schematic representation exemplifying alignment marks formed on a mask and a wafer and electric signals obtainable from these marks.
Figure 2:
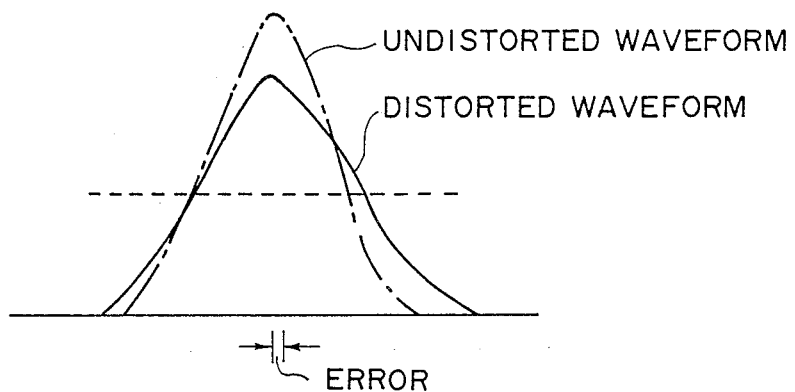
FIG. 2 is a schematic representation for explicating distortion, due to the resist effect, of an electric signal obtained from an alignment mark.

Commonly, the mask-to-wafer alignment is achieved by two alignment steps, i.e., a coarse alignment step (prealignment step) having a relatively rough alignment accuracy on the order of a few microns and final alignment step (fine alignment step) having a very fine alignment accuracy on the order of 0.1 micron. The embodiments of the present invention which will be described later all relate to the latter, namely the fine alignment assuring higher alignment accuracy. At the fine alignment step, in almost all the cases there is a specific regularity in the order of electric signals obtainable from alignment marks of a mask and a wafer, the regularity having been established as a result of the prealignment step. For example, where the alignment marks of the FIG. 1 example described hereinbefore are used, there is a regularity that the first signal denoted at 7 in FIG. 1 is concerned with the mask; the second and third signals denoted at 8 and 9 are concerned with the wafer; and the fourth signal denoted at 10 is concerned with the mask. Also, the distance or interval between the first and second signals 7 and 8 should be within a certain range defined by an error (tolerance) as determined, with respect to a predetermined reference value, by the alignment accuracy of the coarse prealignment step.

Further, the first and fourth signals 7 and 10 are concerned with the same mask alignment mark and spaced from each other exactly by a predetermined distance. On the other hand, the second and third signals 8 and 9 relate to the same wafer alignment mark and are spaced from each other exactly by a predetermined distance. Therefore, the first and fourth signals 7 and 10 can be considered and treated, as a unit, and as a single signal corresponding to the mask alignment mark. Also, the second and third signals 8 and 9 can be considered and treated, as a unit, and as a single signal corresponding to the wafer alignment mark.

From the foregoing, it is seen that a predetermined signal processing operation can be executed for each of or a desired one of the signals 7–10 or, alternatively, for each of the pair of the signals 7 and 10 and the pair of the signals 8 and 9.

The correlation processing is commonly defined, with respect to two functions f(x) and g(x), by the following equation:

$$h(x) = \int_{-\infty}^{\infty} f(y)g(y + x)dy$$

Particularly, in this Specification, such correlation processing that is made, for example, to a portion of the function f(x) and the function g(x), as well as such correlation processing that is made to a specific portion of the function f(x) will be referred to as "partial correlation processing".

Briefly, in accordance with the present invention as will be described later, the correlation processing may be selectively executed only on those signal components which have a considerable degree of noise and/or distortion. Also, in accordance with another aspect of the present invention, different signals (such as a signal from a mask and a signal from a wafer) having different properties (e.g. in amplitude, waveform, etc.) may be subjected to different types of correlation processing operations which are appropriate with respect to the properties of these signals. In any case, the correlation processing is performed to improve the accuracy of position detection.

Specific examples with regard to the correlation processing will now be described in detail.

Figure 3:
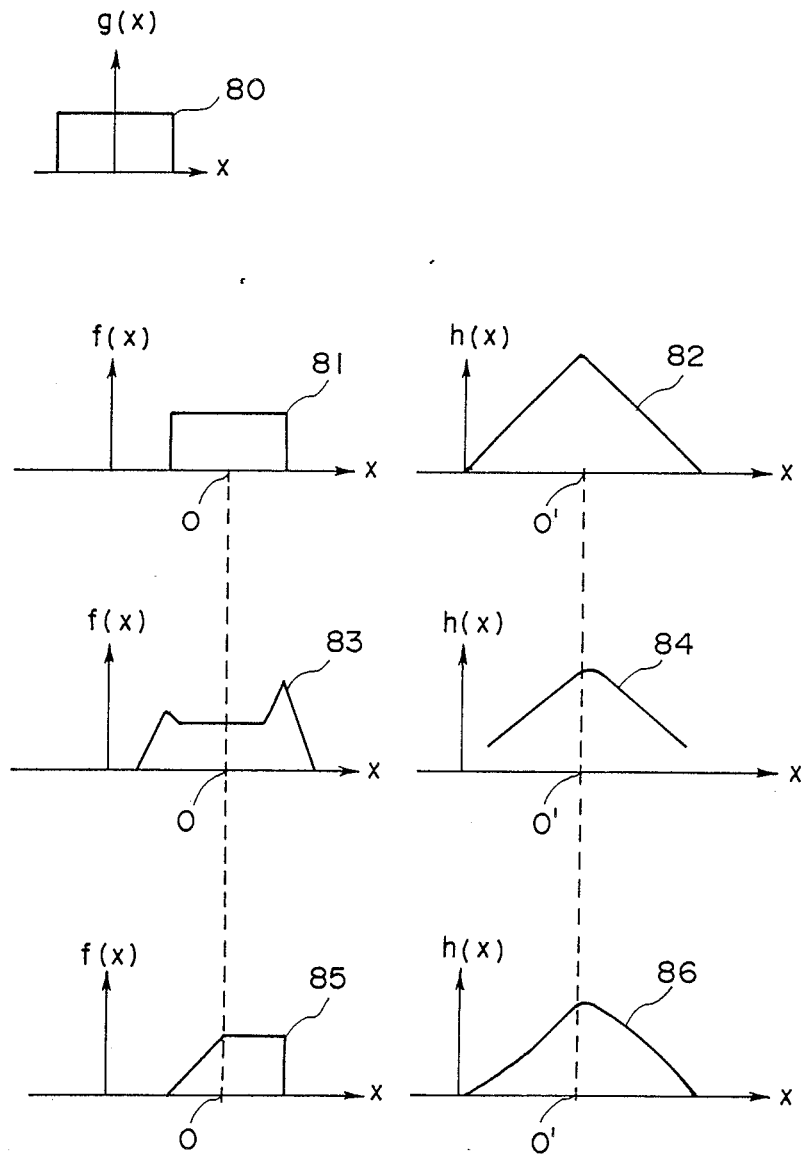
FIG. 3 is a schematic representation for exemplifying the manner of correlation processing made to an electric signal having a generally regular waveform.

FIG. 3 is a schematic representation exemplifying the manner of correlation processing made to a single signal having a predetermined or regular waveform.

In FIG. 3, reference numeral 80 denotes a reference signal which corresponds to the above-described function g(x). Reference numerals 81, 83 and 85 denote, respectively, detected signals which are the subject of the correlation processing, wherein reference numeral 81 depicts an undistorted rectangular signal and reference numerals 83 and 85 depict distorted signals. Each of these signals 81, 83 and 85 corresponds to the above-described function f(x). Also, reference numerals 82, 84 and 86 denote correlation functions, respectively. Of these functions, one denoted at 82 is the correlation function obtainable by executing the correlation processing with respect to the reference signal 80 and the detected signal 81. Similarly, the correlation function denoted at 84 is obtainable by executing the correlation processing with respect to the reference signal 80 and the detected signal 83 while, on the other hand, the correlation function denoted at 86 is obtainable by executing the correlation processing with respect to the reference signal 80 and the detected signal 85. It will be readily understood that each of these correlation functions 82, 84 and 86 corresponds to the above-described function h(x).

In FIG. 3, the position of the center O of the detected signal 81 can be determined on the basis of the peak position O' of the correlation function 82. Also, with regard to the detected signals 83 and 85 which are distorted (as compared with the detected signal 81) due to the above-described resist effect (such as the edge effect) and/or any inclination of a mark detecting optical system, it is seen from the correlation functions 84 and 86 that the position of the center O of each of such distorted signals 83 and 85 can be detected with high accuracy on the basis of the peak position O' of the corresponding one of the correlation functions 84 and 86.

Figure 4:
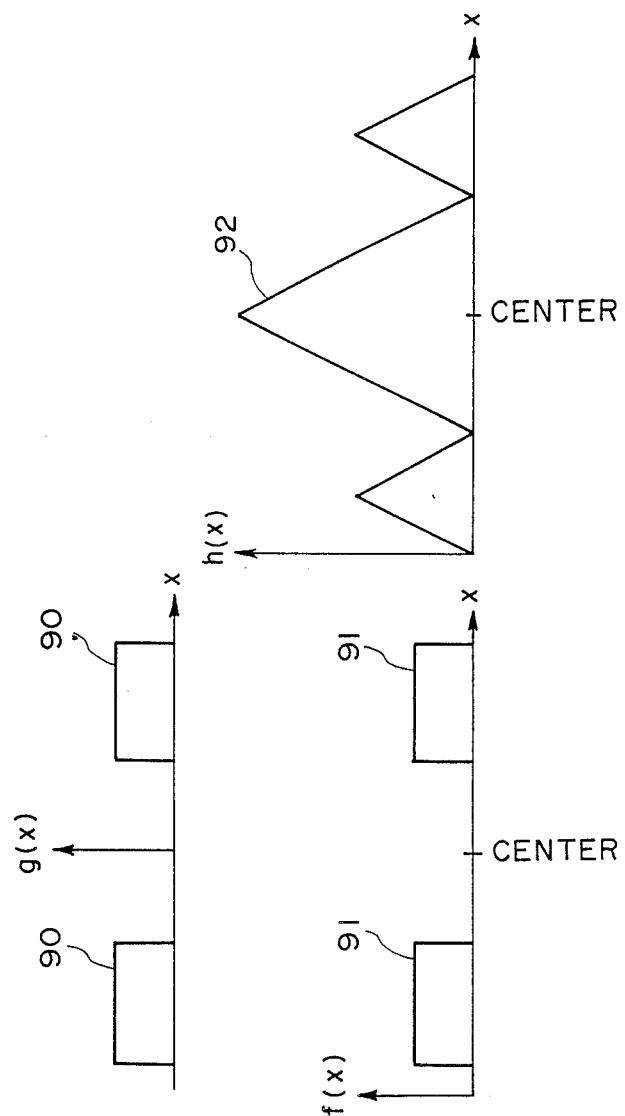
FIG. 4 is a schematic representation exemplifying the manner of correlation processing made to a pair of electric signals each having a generally regular waveform.

FIG. 4 shows an example of correlation processing to be performed on a pair of electric signals. In the FIG. 4 example, reference numeral 90 denotes a reference signal which comprises a pair of signal components. Reference numeral 91 denotes a detected signal comprising a pair of signal components which are the subject of the correlation processing. Reference numeral 92 denotes a correlation function obtainable with respect to the reference signal 90 and the detected signal 91.

In the FIG. 4 example, the position of the center of the paired signal components, constituting the detected signal 91, is detected from the correlation function. Comparing the FIG. 3 case and the FIG. 4 case with each other, it is seen that the correlation function 92 has higher sharpness as compared with the correlation function 82. From this, it is seen that, for the detection of the position of an alignment mark, the mark detection which is based on the detection of the center of paired signals (paired signal components) is preferable to the mark detection which is based on the detection of the center of a single signal (single signal component), in respect to the enhancement of the detection accuracy.

Figure 5:
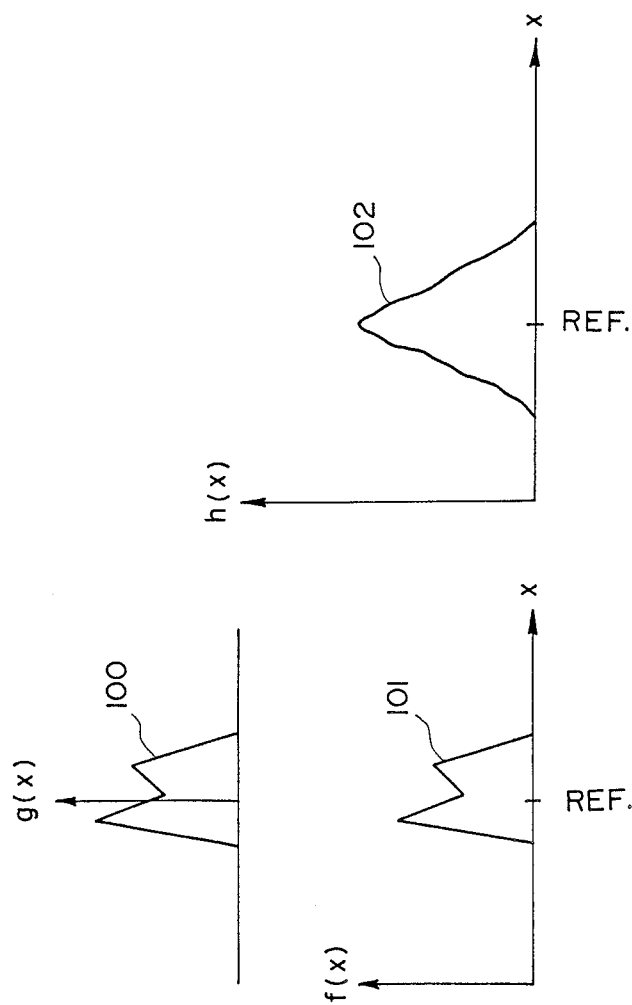
FIG. 5 is a schematic representation exemplifying the manner of correlation processing made to an electric signal having an irregular waveform.

FIG. 5 shows an example of correlation processing to be performed on an electric signal whose waveform is distorted enormously so that the reference position (central position) is difficult to detect without the present invention. In the FIG. 5 example, numeral 100 denotes a reference signal; numeral 101 denotes a detected signal which is the subject of the correlation processing;

and numeral 102 denotes a correlation function. From this example, it is seen that with the present invention the reference position (the position of center) of a detected electric signal, whose center is difficult to be detected without the present invention, can be easily detected on the basis of the peak position of a corresponding correlation function.

In the embodiments of the present invention as disclosed in this Specification, the correlation processing which can provide the above-described advantageous effects may be executed only on a detected electric signal which has a considerable degree of noise and/or distortion or, alternatively, on electric signals that can be detected in a pair. By doing so, the detection accuracy is improved significantly.

Figure 6:
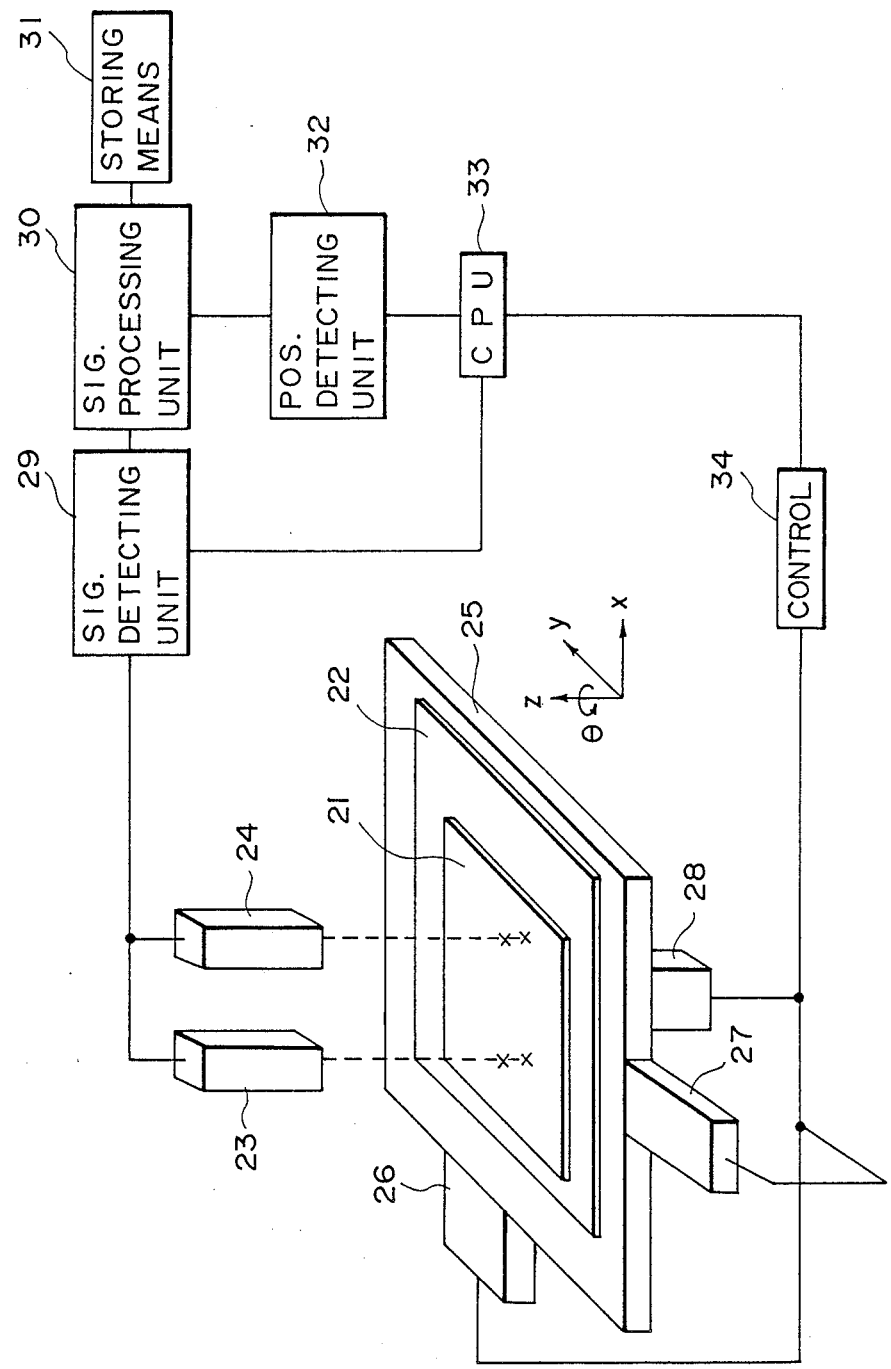
FIG. 6 is a schematic and diagrammatic representation exemplifying an alignment system including a position detecting apparatus according to an embodiment of the present invention.

FIG. 6 schematically and diagrammatically shows an example of an alignment system which includes a position detecting apparatus according to an embodiment of the present invention.

In FIG. 6, there are illustrated a mask 21; a wafer 22; optical systems or electric arrangements 23 and 24 for detecting signals corresponding to alignment marks of the mask and the wafer by use of laser beams or electron beams; a wafer stage 25 for carrying thereon the wafer 22 and movable in two orthogonal directions along X and Y axes as well as in a rotational direction ($\theta$) about a Z axis; driving units 26, 27 and 28 for displacing the stage 25 in the X, Y and $\theta$ (rotational) directions, respectively; a signal detecting unit 29; a signal processing unit 30; a storing means 31; a position detecting unit 32; a central processing unit 33 (hereinafter simply "CPU"); and a control unit 34 adapted to control the driving units 26-28.

The alignment system shown in FIG. 6 is particularly suitable for use in an X-ray aligner wherein a mask such as at 21 is irradiated with X-rays so that a fine circuit pattern formed on the mask is transferred onto a resist layer applied to the surface of a wafer such as at 22.

After the mask 21 and the wafer 22 are aligned with each other as a result of an alignment operation (which will be described later), the flux of X-rays supplied from an X-ray source, not shown, is directed to the mask 21 by way of an X-ray optical system which is provided mainly by plural reflectors. Thus, the resist layer applied to the wafer 22 surface is exposed to X-rays which are passed through the mask 21.

Each of the optical systems 23 and 24 is movably supported by its own driving means, not shown, so that it can be retracted out of the path of the X-ray flux at the time of the X-ray exposure. For this purpose, the control unit 34 produces instruction signals which are supplied, respectively, into the two unshown driving means by way of signal lines, not shown. In response thereto, the optical systems 23 and 24 are moved by their driving means.

The mask 21 and the wafer 22 are provided with alignment marks such as shown at 1-5 in FIG. 1.

Figure 7:
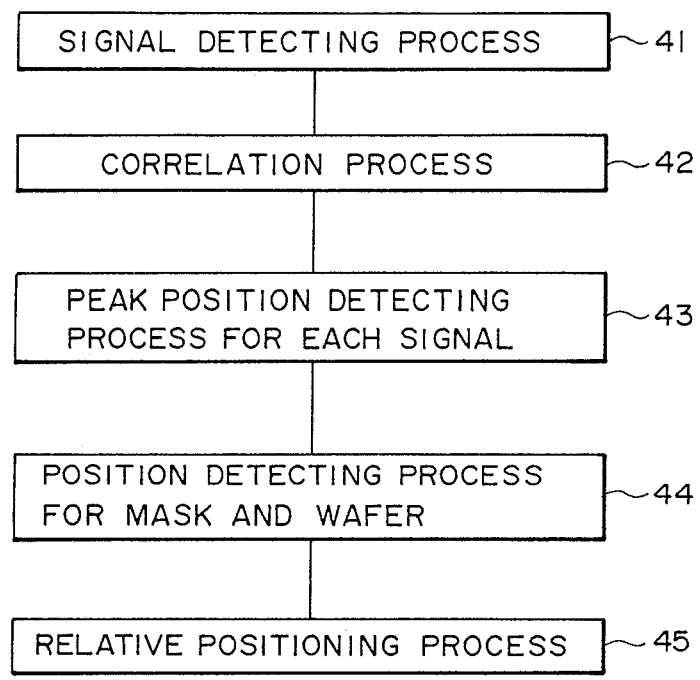
FIG. 7 is a flow chart for explicating the operation performed in the alignment system of the FIG. 6 example.

FIG. 7 is a flow chart showing the operation of the alignment system of the FIG. 6 embodiment.

As shown in FIG. 7, the alignment operation includes a step 41 of signal detecting process; a step 42 of partial correlation process; a step 43 of peak position detecting process for each signal; a step 44 of position detecting process for detecting the positional relation between the mask and the wafer; and a step 45 of relative positioning process for bringing the mask and the wafer into a predetermined positional relation.

Referring to the flow chart of FIG. 7, the operation of the alignment system of the FIG. 6 embodiment will be described in detail.

First, in the signal detecting process (step 41), the signal detecting unit 29 detects mark signals corresponding to the alignment marks of the mask and the wafer. For this purpose, the optical systems 23 and 24 are used to scan each of the alignment marks with a laser beam or an electron beam in two orthogonal directions (X and Y directions). A mark signal is detectable by detecting light reflected from an alignment mark or by detecting electrons such as secondary electrons caused in response to the irradiation of an electron beam.

If each of the mask 21 and the wafer 22 is provided with two alignment marks formed at two spaced locations and where each of these mask and wafer alignment marks is such as shown in FIG. 1, there are produced four sets of time-series signals (each set of signals being such as denoted at 7-10 in FIG. 1) as a result of the scan of the two pairs of mask and wafer alignment marks in the two orthogonal directions. Further, the noise in the high frequency region contained, if any, in each mark signal detected can be removed by use of a low-pass filter which may be incorporated into the signal detecting unit 29.

Next, in the partial correlation process (step 42), output signals of the signal detecting unit 29 obtained as a result of the signal detecting process (step 41) are subjected within the signal processing unit 30 to the partial correlation processing with respect to a reference signal which has been stored in the storing means 31.

The manner of such correlation processing is schematically illustrated in FIG. 8. In this Figure, numerals 50-53 denote signals (to be used for the position detection) in one of the four sets of signals obtained by the signal detecting process. These signals 50-53 correspond respectively to the signals 7-10 shown in FIG. 1. Numeral 54 denotes a reference signal and numerals 55-58 denote, respectively, output signals as obtainable as a result of the partial correlation processing made to the signals 50-53 with respect to the reference signal 54.

Each of these output signals 50-58 is subjected to the peak position detecting process (step 43) by use of the position detecting unit 32. By this, the peak position of each of the signals 55-58, namely the position of the center of each of the signals 50-53, is detected. Subsequently, in the position detecting process for the mask and the wafer (step 44), the CPU 33 operates to calculate, on the basis of the thus detected peak positions of the signals, the intervals t1 and t2 between the signals 55 and 56 and between the signals 57 and 58. Since, in this example, the alignment marks of the type shown in FIG. 1 are used, the positional error (positional deviation) between the mask 21 and the wafer 22 can be determined in accordance with the equation (1).

It is to be noted that the length t1 or t2 is represented by a time interval between two signals. Such time interval can be measured by use of suitable timing clocks. Of course, this time interval is proportional to the spacing between the alignment marks (mark elements).

From the foregoing, it is seen that in the graphs of FIG. 8 related to the detected signals (f), the reference signal (g) and the correlation output signals (h), the axis of abscissa denotes time. This is also with the case of FIG. 9 which will be described later.

The above-described operation is executed on each of the four sets of time-series signals obtained as a result of the scan of the two pairs of alignment marks in the two orthogonal directions. From the right-hand pair of alignment marks, positional deviations $dX_R$ and $dY_R$ with respect to the X and Y directions are detectable. On the other hand, from the left-hand pair of alignment marks, positional deviations $dX_L$ and $dY_L$ with respect to the X and Y directions are detectable.

From these results, the positional error between the mask and the wafer with respect to the X, Y and $\theta$ (rotational) directions can be calculated by the following equation:

$$dX=(dX_R+dX_L)/2 \tag{2}$$

$$dY=(dY_R+dY_L)/2 \tag{3}$$

$$dR=(dY_R+dY_L)/D \tag{4}$$

wherein dX is a positional error component in the X direction, dY is a positional error component in the Y direction, dR is a positional error component in the rotational direction and D is the distance between the right-hand and left-hand alignment marks.

In the relative positioning process, (step 45), the wafer stage 25 is moved in the X, Y and $\theta$ directions by the driving units 26–28 under the influence of the control by the control unit 34, so as to remove the positional error as calculated by the equations (2) to (4). By this, the mask-to-wafer alignment is accomplished. Thereafter, the above-described exposure operation is initiated.

In the present embodiment, one reference signal such as at 54 in FIG. 8 is used for the correlation processing of the detected signals 50–53. However, the present invention is not limited thereto. For example, as shown in FIG. 9, two sets of reference signals, one comprising a pair of signals 64 and 65 and the other comprising a pair of signals 66 and 67, may be used. In this example, the first pair of reference signals 64 and 65 are used for the partial correlation processing of detected signals 60 and 63 corresponding to a mask alignment mark, whereas the second pair of reference signals 66 and 67 are used for the partial correlation processing of detected signals 61 and 62 corresponding to a wafer alignment mark. Executing the correlation processing of the mask alignment mark signals and the correlation processing of the wafer alignment mark signals, independently of each other, is very effective to further enhance the detection accuracy.

The positional deviation detectable in such case is an interval t3 between peaks of two signals 68 and 69 which are obtained as a result of the separate correlation processing operations described above.

It is a possible alternative that the partial correlation processing of the detected signals 60 and 63 corresponding to the mask alignment mark and the partial correlation processing of the detected signals 61 and 62 corresponding to the wafer alignment mark is executed in parallel to each other. Also, they may be effected sequentially in a time-series manner.

With the present invention as described in the foregoing, various advantageous effects such as follows are obtainable:

(1) Even with signals having a poor signal-to-noise ratio, such as those which are usually produced in an alignment step to be made in preparation for the photoprinting of aluminum wiring, the position detection is still possible with sufficient accuracy.

(2) The effect of the distortion in a detected signal can be reduced.

(3) Where a reference signal comprising plural signal elements is used for the correlation processing of a detected signal comprising plural signal components, the sharpness or acuteness of the waveform of a signal representing the correlation function can be made higher, with the result that the detection accuracy can be improved to a greater extent.

(4) Even for a signal waveform whose reference position (e.g. the position of center) is difficult to be detect with the present invention the reference position can be detected easily.

As has been described with reference to the foregoing embodiment, the position of the center of a detected signal is detectable from the peak position of a corresponding correlation function. If, however, the detected signal contains excessive distortion, the obtained correlation function is distorted accordingly. If this occurs, there arises a possibility that the peak position detecting process is complicated with the result that a longer time is required for the processing. In consideration of this, in an embodiment described later, rough position-detection is executed with regard to each detected signal, prior to the execution of its correlation processing. After the rough position-detection, the partial correlation processing is executed with respect to the neighboring portion of the position of each signal as determined as a result of the rough position-detection, whereby a correlation function is obtained Then, the peak position of the obtained correlation function is detected This effectively provides various advantageous effects such as follows:

(1) The correlation function h(x) can be detected simply by executing integration only in a limited range of $[Y_0+a, Y_0-a]$ wherein $Y_0$ is the position as determined by the rough position-detection. Therefore, the time necessary for the correlation processing can be reduced.

(2) Since the detection of the peak position of a correlation function within a narrow range is sufficient, only a simple operation is required for the processing, with the result that the processing time can be reduced.

(3) Detection of a fine correlation function is effective to improve the accuracy of the position detection.

Namely, in this embodiment, the disadvantages arising in the foregoing embodiment can be fully avoided. Further, details of the present embodiment will be described below.

Figure 10:
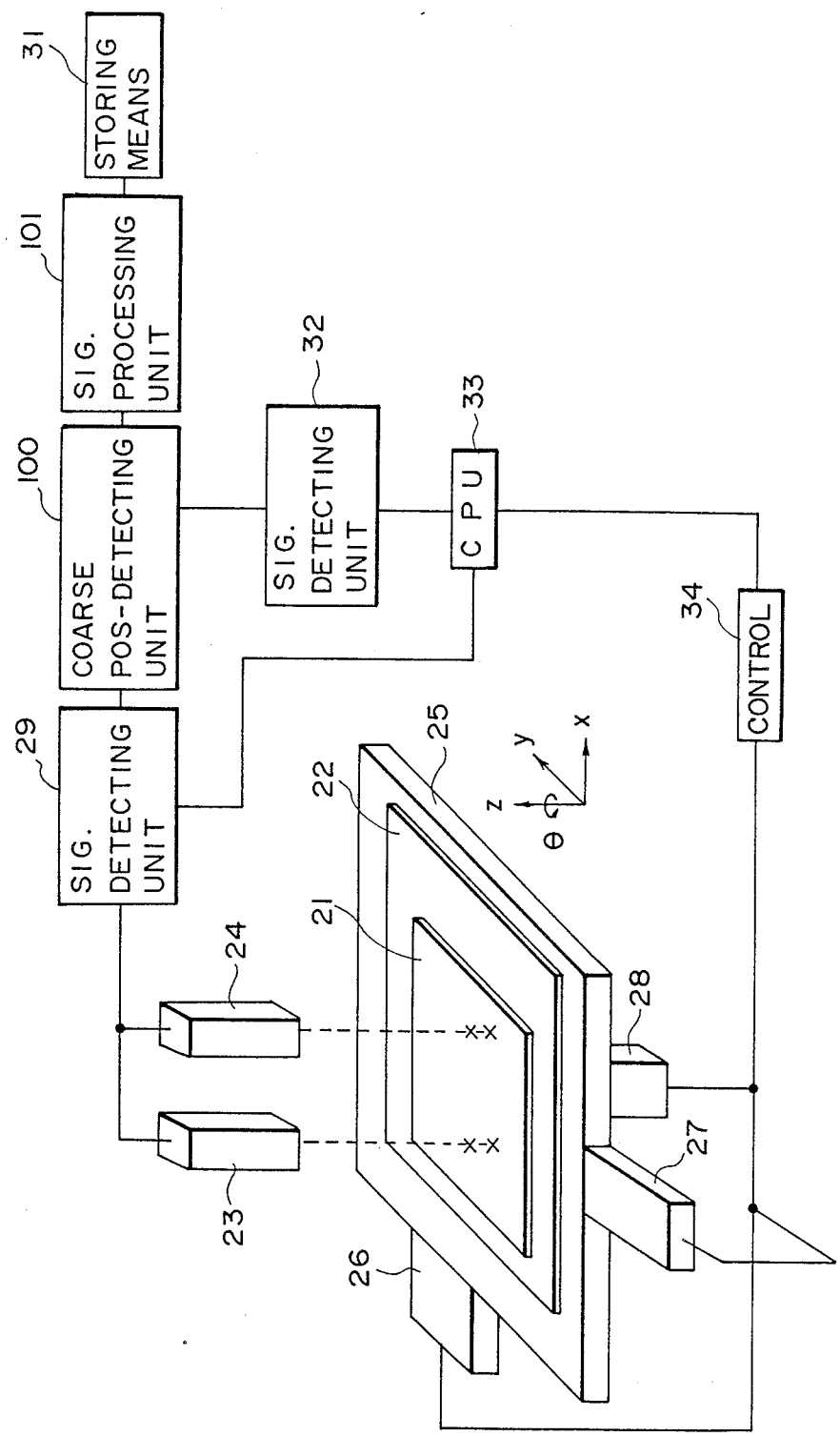
FIG. 10 is a schematic and diagrammatic representation showing another example of the alignment system including a position detecting apparatus according to another embodiment of the present invention.

FIG. 10 schematically and diagrammatically shows an example of an alignment system including a position detecting apparatus arranged in accordance with this feature of the present invention.

In FIG. 10, there are illustrated a mask 21; a wafer 22; optical systems or electric arrangements 23 and 24 for detecting signals corresponding to alignment marks of the mask and the wafer by use of laser beams or electron beams; a wafer stage 25 for carrying thereon the wafer 22 and movable in two orthogonal directions along X and Y axes as well as in a rotational direction ($\theta$) about a Z axis; driving units 26, 27 and 28 for displacing the stage 25 in the X, Y and $\theta$ (rotational) directions, respectively; a signal detecting unit 29; a storing means 31; a position detecting unit 32; a central processing unit 33 (hereinafter simply "CPU"); a control unit 34 adapted to control the driving units 26–28; a coarse position-detecting unit 100 adapted to roughly detect the position of each detected signal; and a signal processing unit 101.

The alignment system of the present embodiment is similar to that of the FIG. 6 embodiment, but in the present embodiment the coarse position-detecting unit 100 is added and the signal processing unit 101 for detecting a correlation function in a limited range is used in substitution for the signal processing unit 30 of the FIG. 6 embodiment. Similar to the FIG. 6 embodiment, the alignment system of the present embodiment is particularly suitably usable in an X-ray aligner.

Figure 11:
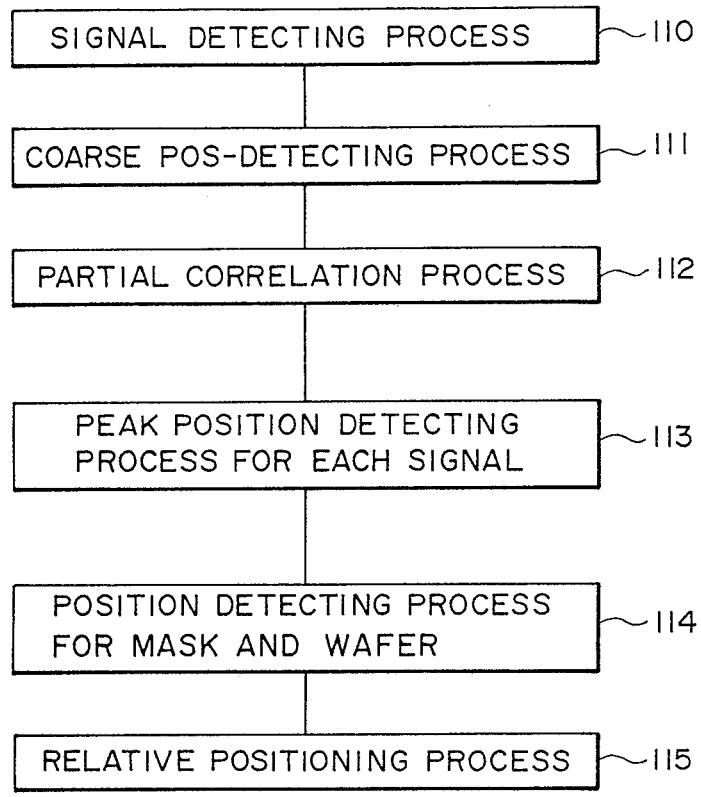
FIG. 11 is a flow chart explicating the operation performed in the alignment system of the FIG. 10 example.

FIG. 11 is a flow chart showing the operation of the alignment system of the FIG. 10 embodiment. As shown in FIG. 11, the alignment operation includes a step 110 of signal detecting process; a step 111 of coarse position-detecting process; a step 112 of partial correlation process; a step 113 of peak position detecting process for each signal; a step 114 of position detecting process for detecting the positional relation between the mask and the wafer; and a step 115 of relative positioning process for bringing the mask and the wafer into a predetermined positional relation.

The alignment system of the present embodiment will be described in detail, only with respect to the distinctive features thereof as compared with the FIG. 6 embodiment.

Where alignment marks of the type shown in FIG. 1 are used, signals which are detectable as a result of the signal detecting process (step 110) are such as shown in FIG. 12. In this Figure, signals denoted at 120–123 are obtained from the alignment marks of the mask 21 and the wafer 22, particularly the portions denoted at 2, 5 and 4 in FIG. 1.

The coarse position-detecting unit 100 is arranged to binarize, with a suitable slice level, each of the detected signals 120–123 obtained from the signal detecting unit 29, whereby binary-coded signals 120'–123' having rectangular waveforms are produced. Then, the position of the center of each rectangular pulse signal is detected at step 111 in a manner which is known per se. Here, for explanation, the positions of the centers of the binarized signals 120'–123' are represented by $T_1$, $T_2$, $T_3$ and $T_4$, respectively. If noise and/or distortion is contained in the detected signal, the accuracy of the numerical value concerning the position of the center of the rectangular pulse signal will be merely of an order of 0.1–1.0 micron, which is insufficient. Namely, the position detection at step 111 is "rough" in such case.

In the signal processing unit 101, the signals 120–123 are subjected to the partial correlation processing (step 112) with respect to the reference signal 124, in the manner similar to that made in the foregoing embodiment. It is to be noted here that, where each of the signals 120–123 is represented by a function f(x) and the reference signal 124 is represented by g(x), in the foregoing embodiment a calculation according to the following equation:

$$h(x) = \int_{T_s}^{T_n} f(Y)g(y + x)dy \quad (5)$$

has been made in a range "$T_n > Y > T_s$".

In the present embodiment, as compared therewith, calculations according to the following equations (6) to (9) are made in limited ranges "$T_1+a>Y>T_1-a$", "$T_2+a>Y>T_2-a$", "$T_3+a>Y>T_3-a$" and "$T_4+a>Y>T_4-a$":

$$h_1(x) = \int_{T_1 - a}^{T_1 + a} f_1(Y)g(y + x)dy \quad (6)$$

$$h_2(x) = \int_{T_2 - a}^{T_2 + a} f_2(Y)g(y + x)dy \quad (7)$$

$$h_3(x) = \int_{T_3 - a}^{T_3 + a} f_3(Y)g(y + x)dy \quad (8)$$

$$h_4(x) = \int_{T_4 - a}^{T_4 + a} f_4(Y)g(y + x)dy \quad (9)$$

wherein $f_1$–$f_4$ denote the signals 120–123, respectively; $h_1$–$h_4$ denote the signals 125–128, respectively; and a denotes a parameter which determines the range of integration and which has a value approximately equal to the width of each signal.

As compared with the signal processing made in the foregoing embodiment, the signal processing in the present embodiment has a distinctive feature that the range of integration is narrow. Also, the range of the variable Y is narrow. As a result, the time necessary for the processing can be reduced remarkably. Further, it is to be noted that, by narrowing the sampling interval for the variable Y, the detection accuracy can be improved more significantly.

In the present embodiment, only one reference signal such as at 124 in FIG. 12 is used for the correlation processing of the detected signals 120–123. However, as has been described with reference to FIG. 9, two sets of reference signals each comprising paired signals may be used for the detection of the mask alignment mark and for the detection of the wafer alignment mark, separately. Namely, a first set of reference signals may be used for the partial correlation processing of the detected signals 120 and 123 corresponding to the mask alignment mark, while a second set of reference signals may be used for the partial correlation processing of the detected signals 121 and 122 corresponding to the wafer alignment mark. By doing so, further enhancement of the detection accuracy is attainable.

In this alternative example and during the coarse position-detecting process, the approximate position of the center of each of the signals 120–123 is detected in the similar manner as the foregoing embodiment. Then, the center $T_5$ between the signals 120 and 123 as well as the center $T_6$ between the signals 121 and 122 are detected. Subsequently, in the partial correlation process (step 112), the following calculations are made:

$$h_5(x) = \int_{T_5 - a'}^{T_5 + a'} f(Y) g_1(y + x)dy$$

$$h_6(x) = \int_{T_6 - a'}^{T_6 + a'} f(Y) g_2(y + x)dy$$

wherein $g_1$ is the mask alignment mark detecting reference signal, $g_2$ is the wafer alignment mark detecting reference signal, $h_5$ is a signal representing a first correlation function, $h_6$ is a signal representing a second correlation function, and f is each of the signals 120–123 shown in FIG. 12.

By using this method, signals such as shown at 68 and 69 in FIG. 9 are obtained. Thus, from the interval t3 between these signals 68 and 69, the positional error dt is determined because dt=t3.

It will be readily understood that the signal $h_5$ representing the first correlation function is used for the position detection with respect to the mask alignment mark, while the signal $h_6$ representing the second correlation function is used for the position detection with respect to the wafer alignment mark.

In accordance with the position detecting method having been described with reference to FIGS. 10–12, the execution of the correlation processing in the described manner assures that the position of the center of each detected signal is determined with high accuracy. Additionally, by specifying or limiting the range of processing (the range of integration) at the time of correlation processing, high-speed signal processing is made attainable. Accordingly, with the position detecting method of the present invention, high-speed and high-accuracy detection of the position is ensured. As a result, where the present invention is applied to an alignment system in a semiconductor device manufacturing exposure apparatus such as described with reference to the foregoing embodiments, specific and significant advantageous effects are obtainable.

Description will now be made to another embodiment of the present invention.

As has been described with reference to the foregoing embodiments, the position of the center of a detected signal is detectable from the peak position of a corresponding correlation function If, however, the signal-to-noise ratio is very low, this is not always easy to achieve.

Usually, in order to extract and detect, at high accuracy, a signal separately out of noise components in accordance with the correlation method, it is desired that a value as great as possible is obtainable by the following calculation:

$$\left\{ \int_{-\infty}^{\infty} s(y)g(y + x)dy \right\} / \left\{ \int_{-\infty}^{\infty} n(y)g(y + x)dy \right\} \quad (10)$$

wherein s is the signal to be detected, n is the noise, g is the reference signal and x is a value which makes $$\text{``} \int_{-\infty}^{\infty} s(y)g(y + x)dy \text{''}$$

maximum.

To ensure this, the following two conditions are required:

Condition ①: to increase $\int_{-\infty}^{\infty} s(y)g(y + x)dy$ and

Condition ②: to decrease $\int_{-\infty}^{\infty} n(y)g(y + x)dy$

If, for example, it is assumed that $$s(y)=g(y) \quad (11)$$

then, the condition ① is satisfied when $$\int_{-\infty}^{\infty} s(y)g(y + x)dy = \int_{-\infty}^{\infty} s(y)s(y + x)dy \quad (12)$$

This is an autocorrelation of s(y) and, as is well known, it follows that:

(i) Equation (12) provides the maximum when x=0;

(ii) The value of equation (12) may be increased by increasing the power of the signal.

On the other hand, the condition ② is satisfied by using such a reference signal g which has a lower degree of correlation with the noise.

It will be understood from the foregoing that, in a case where the noise shows some periodicity, it is desirable to use an alignment mark formed by a grid-like pattern having periodicity different from that of the noise. When such an alignment mark is used and is scanned by use of a light beam or an electron beam having sufficiently high intensity (or power), the above-described conditions ① and ② can be satisfied with the result that high accuracy position detection is assured. An embodiment of the present invention which will be described below is based upon the above-described finding made by the inventor of the subject application. In the case of position detection to be made in a semiconductor device manufacturing exposure apparatus, usually, only such electric signals as detected with respect to a wafer contain a particularly large amount of noise components due to the resist effect. In consideration of this, only the alignment marks of the wafer may be formed by grid-like patterns. Also, it is to be noted that the condition ① is effective to enhance the detection accuracy.

Figure 13:
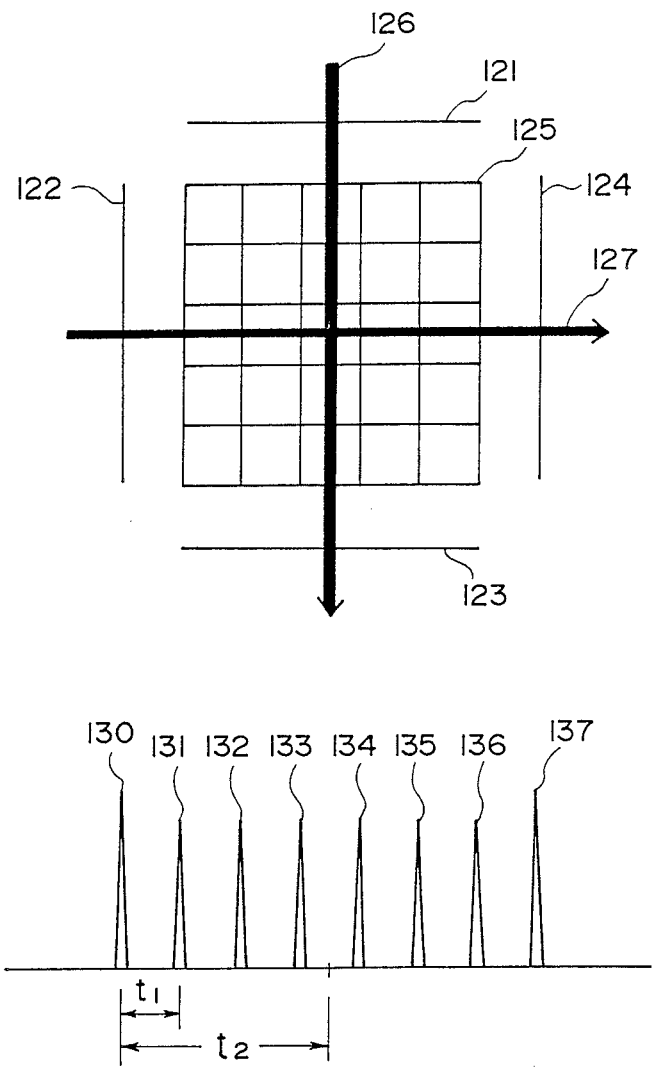
FIG. 13 is a schematic representation exemplifying a mask alignment mark and a wafer alignment mark of different type, and the electric signals obtainable from these marks.

Description will now be made to an embodiment which uses the principle described just above. In the present embodiment, alignment marks such as illustrated in FIG. 13 are used. Also, for convenience, the alignment system shown in FIG. 10 is referred to again, for the explanation of an alignment system capable of processing signals, detected from an alignment mark, in accordance with the above-described principle thereby to detect the position of the alignment mark. Namely, the present embodiment will be described also in conjunction with FIGS. 10 and 11.

The position detecting operation using the principle of detection of the present embodiment will be described in detail, by use of the flow chart of FIG. 11.

First, in the signal detecting process (step 41), such signals as depicted in the lower part of FIG. 13 are detected from the alignment marks as illustrated in the upper part of FIG. 13. Reference numerals 121–124 in FIG. 13 denote mark elements of an alignment mark formed on a mask; numeral 125 denotes a grid-like alignment mark formed on a wafer; numerals 126 and 127 denote orthogonally extending scanning lines along which the alignment marks of the mask and the wafer are scanned with scanning light beams or electron beams; numeral 130 denotes a signal which is detectable in response to the intersection of the scanning line 127 with the mark element 122 of the mask alignment mark; numerals 131–136 denote signals obtainable in response to the intersection of the scanning line 127 with the mark elements of the wafer alignment mark 125; numeral 137 denotes a signal detectable in response to the intersection of the scanning line 127 with the mark element 124 of the mask alignment mark.

Subsequently, in the coarse position-detecting process (step 110), the coarse position-detecting processing unit 100 is used to detect an approximate position of each of the signals 130 and 137 as well as the position of each of the grouped signals 131–136. This can be done essentially in the same manner as has been described hereinbefore with reference to the foregoing embodiments. If there exists substantially no noise, the positional error may be detected by detecting the interval between the signals 130 and 131 as in the foregoing embodiments. If, however, the level of the noise is approximately equal to or near that of the signals, it is no more possible to detect the positional error in this manner.

Where the noise has a periodicity, in other words, if the noise has high power or intensity at a particular frequency or frequencies, it is possible to assure that a detected signal has a different periodicity. This is attainable by suitably setting the pitch of the grid-like pattern of the alignment mark 125 (because the periodicity of the noise can be detected preparatorily). Based on this finding, the alignment mark 125 of the present embodiment is designed with a suitable pitch.

Where the frequency of a signal corresponding to the alignment mark 125, which frequency is determined by the pitch of the mark, is denoted by $f_0$ and since the number of the bar-like elements constituting the grid of the pattern of the alignment mark is limited or finite, the frequency characteristics of the detected signal show an extension about the frequency $f_0$. Also, there appears a sideband wave. Therefore, when only the frequency components which are near the frequency $f_0$ are extracted out of the detected signal, then substantially no noise is included in the extracted components. A signal obtained in this manner has a peak corresponding to the position of the center of a corresponding one of the signals 131–136.

The present embodiment is based on the above-described theory, and, in this embodiment, the wafer alignment mark signals are selectively extracted out of the detected signals. This is easily attainable because the interval between a mask alignment mark signal and a wafer alignment mark signal is usually in a limited range as a result of the prealignment. The extracted signal components are processed by use of a band-pass filter which is adapted to transmit the frequency components near the frequency $f_0$. The resultant signals are binarized with a suitable slice level. Thus, the peak positions of the signals 131–136 can be detected on the basis of the binarized signals.

By the position detecting steps described hereinbefore, it is now possible to roughly detect the position of the center of the signal train, comprising the signals 131–136, quickly and without being affected by the noise.

If, however, the wafer alignment mark is provided with a grid-like pattern having a small number of bar-like elements, constituting the grid pattern, it is not possible to ensure high-accuracy with the position detecting method described above. In such case, therefore, the position detecting method based on the above-described principle may be used as means for roughly detecting the position.

Referring back to FIG. 11, in the partial correlation process (step 111), the signal processing unit 101 is used so as to execute, in the manner described with reference to FIG. 12, the correlation processing for the mask alignment mark signals and for the wafer alignment mark signals. The manner of such processing is illustrated in FIG. 14.

In FIG. 14, numerals 140 and 141 denote reference signals, respectively; numeral 142 denotes a correlation function with regard to the reference signal 140 and the signals 130 and 137 obtained from the mask alignment mark; and numeral 143 denotes a correlation function with regard to the reference signals 141 and the signals 131–136 obtained from the wafer alignment mark.

In the peak position detecting process (step 112) for each signal, the position detecting unit 102 is used to detect the peak position of each of the correlation functions 142 and 143. The interval between the detected peaks of these functions corresponds to the positional error.

In the present embodiment, similarly to the foregoing embodiments, each of the two pairs of alignment marks provided at two spaced locations is scanned along two orthogonal directions, whereby four sets of time-series signals are obtained. The above-described signal processing is carried out for each of the four sets of time-series signals, whereby the positional error components in the X, Y and $\theta$ (rotational) directions are detected.

In the relative positioning process (step 115), the detected positional error is corrected in the same manner as described hereinbefore, whereby the mask-to-wafer alignment is accomplished.

While in the present embodiment alignment marks such as illustrated in FIG. 13 are used, it is to be noted that the positional relation of each of the scan lines 126 and 127 with the wafer alignment mark 125 is restricted. This is inconvenient.

Figure 15:
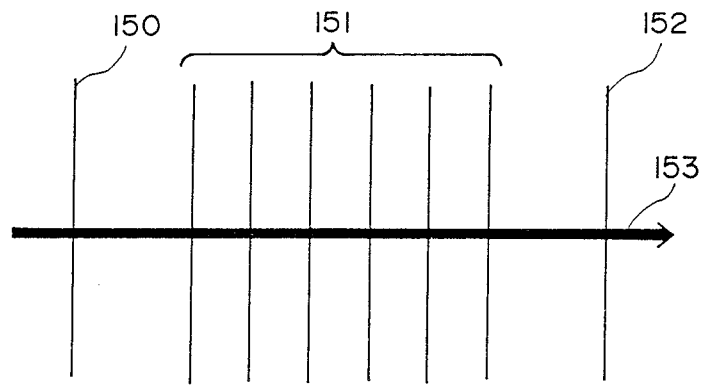
FIG. 15 is a schematic representation exemplifying another form of a mask alignment mark and a wafer alignment mark, usable with the present invention.

FIG. 15 exemplifies alignment marks which are free from such restriction. In FIG. 15, numerals 150 and 152 denote mark elements of an alignment mark formed on a mask; numeral 150 denotes mark elements of an alignment mark formed on a wafer; and numeral 153 denotes a scan line along which the alignment marks of the mask and the wafer are scanned with a light beam or an electron beam.

Where alignment marks of the type shown in FIG. 15 are used, there is no restriction with regard to the scan line 153. In such case, however, only the positional information in a single direction is obtainable from one set of mask alignment marks and wafer alignment marks. Therefore, it is necessary to provide alignment marks at three spaced locations on the mask or wafer or, alternatively, each of the mask and the wafer in order to obtain positional information with regard to three directions (X, Y and $\theta$ directions). One or more optical systems may be used to detect these alignment marks.

Figure 16:
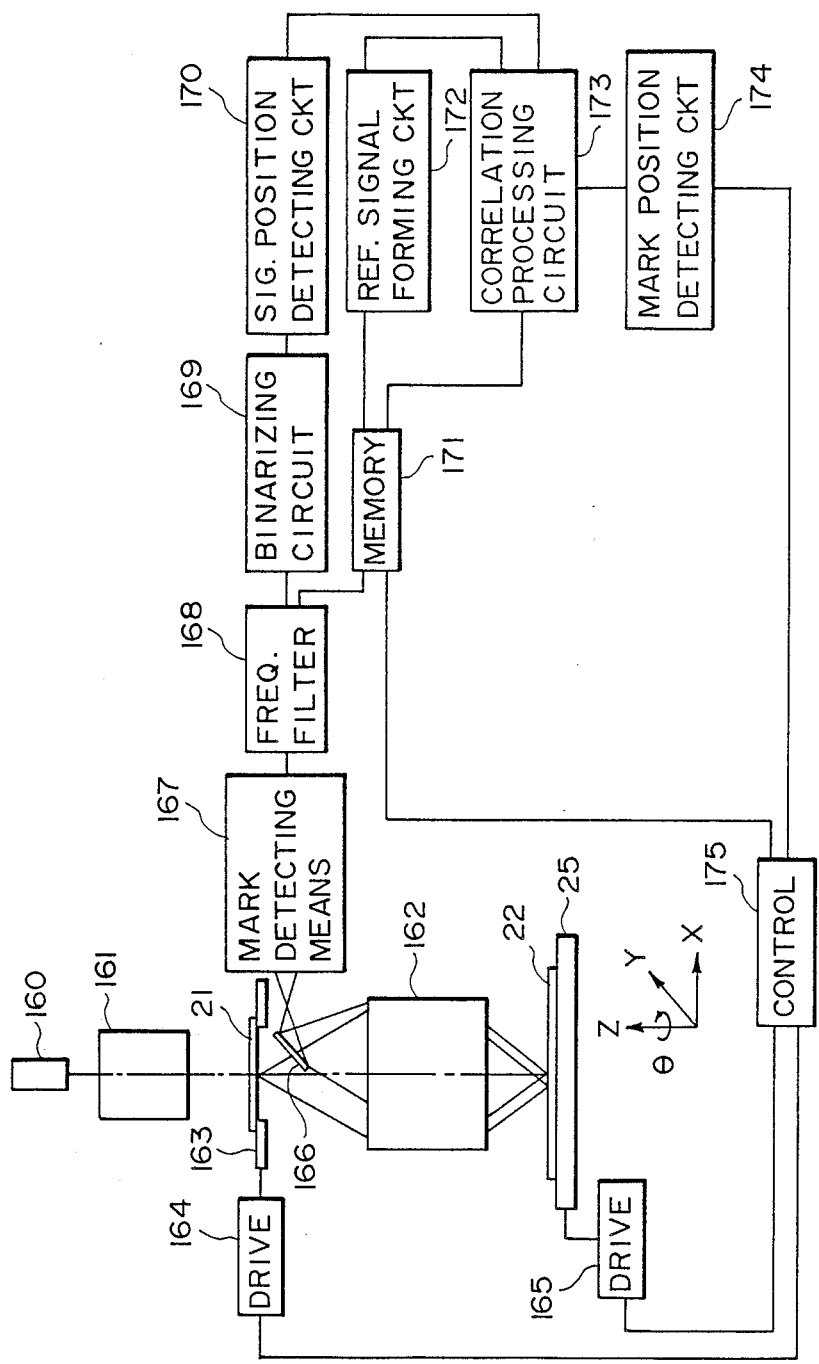
FIG. 16 is a schematic and diagrammatic representation showing an example of a reduction projection type alignment and exposure system wherein the position of each wafer alignment mark is detected in accordance with the position detecting method of an embodiment of the present invention.

Referring now to FIG. 16, there is schematically and diagrammatically illustrated an alignment and exposure system which is arranged so that a reticle 21 and a wafer 22 are aligned and a circuit pattern formed on the reticle 21 is transferred in a reduced scale onto the wafer 22 by means of a reduction projection lens system 162.

In the arrangement show in FIG. 16, the reticle 21 is held by a reticle stage 163 which is movable in the X, Y and $\theta$ (rotational) directions. The displacement of the reticle stage 163 is achieved by use of a driving means 164. On the other hand, the wafer 22 is held on a wafer stage 25 which is movable, as in the foregoing embodiments, in the X, Y and $\theta$ directions under the influence of a driving means 165.

The wafer stage 25 is movable also in the Z direction with the aid of a focussing means, not shown, so that the surface of a resist layer formed on the wafer 22 is placed exactly in an image plane of the projection lens system 162.

Denoted at 160 is a light source for producing light to be used for the exposure of the wafer 22. The light source 160 may comprise an Hg lamp, an excimer laser or otherwise. The light supplied from the light source 160 is directed to the reticle 21 by way of an illumination system 161, thereby to illuminate an area, on the reticle 21, to be irradiated. Where the light source 160 is of the type that produces coherent light, as in the case of an excimer laser, the illumination system 161 may preferably includes means for transforming the coherent light into incoherent light.

The circuit pattern of the reticle 21 as irradiated with the light from the illumination system 161 is projected by means of the reduction projection lens system 162, having plural lenses, upon the resist surface on the wafer 22 which is placed exactly in the image plane of the projection lens system.

The reticle 21 has alignment marks formed at predetermined locations thereon. A reticle alignment scope system, not shown, is used to observe or detect the positions of the reticle alignment marks. In accordance with the result of detection, the reticle 21 is aligned with respect to a predetermined reference or standard position defined in the exposure apparatus itself and, thereafter, the reticle 21 is held fixed in that state.

On the other hand, the wafer 22 has plural shot areas (areas to be exposed to the patterned light from the reticle 21 in sequence). In each of these shot areas, plural alignment marks are formed. The wafer 22 is aligned with respect to a predetermined reference or standard position (defined in a suitable portion of the alignment system) in the manner which will be described later.

In FIG. 16, a total reflection mirror 166 is disposed in the optical path between the reticle 21 and the projection lens system 162. The mirror 166 is arranged to be moved by a driving means, not shown, so that it can be retracted out of the optical path at the time of transfer of the circuit pattern.

For the alignment of a particular shot area on the wafer 22, the alignment marks formed in that shot area is illuminated, in sequence, by light supplied for the alignment purpose. The light reflected from such a region including an alignment mark is directed by way of the total reflection mirror 166 to a wafer alignment mark detecting means 167. The mark detecting means 167 includes an alignment optical system and a photodetector such as an image pickup device. Where the wafer alignment marks used are of the type such as illustrated at 151 in FIG. 15, then signal trains each comprising signals such as at 131–136 in FIG. 13 are obtainable, by passing the output signals of the detecting means 167 (obtained by photoelectric conversion) through a frequency filter 168. The frequency filter 168 may comprise a low-pass filter or a band-pass filter.

As show in FIG. 16, the system further includes a binarizing circuit 169 which is adapted to binarize, with a suitable slice level, signals of the signal trains from the frequency filters 168. Further, the signal trains from the frequency filter 168 are applied also to a memory 171. The memory 171 is operable in response to a predetermined control signal to apply the signal train to the succeeding circuit means.

Denoted at 170 in FIG. 16 is a signal position detecting circuit having functions similar to those of the coarse position-detecting unit 100 in the FIG. 10 embodiment. The signal position detecting circuit 170 is operable to roughly detect the position of the center of each of the pulse signals which constitute the signal train having been binarized by the binarizing circuit 169. Electric signals representing the result of detection at the signal position detecting circuit 170 are supplied into a correlation processing circuit 173 which will be described later in detail.

The system further includes a reference signal forming circuit 172 into which each signal train as stored in the memory 171 are supplied. In this reference signal forming circuit 172, a single or plural signals in each signal train are used to form one reference signal. Thus, the formed reference signal is applied to the correlation processing circuit 173.

On the other hand, the signal trains as having been stored in the memory 171 are also applied directly to the correlation processing circuit 173 at suitable timing. In this correlation processing circuit 173, the signals of each signal train (which are the low data obtained from the spatial filter 168) and a reference signal supplied from the reference signal forming circuit 172 are subjected to the correlation processing, whereby a signal (correlation signal) which corresponds to a correlation function is produced. It is to be noted here that the correlation processing made to each signal in the correlation processing circuit 173 is conducted with respect to a predetermined narrow range, which is determined with reference to the approximate position of the center of each signal as roughly determined by the signal position detecting circuit 170, as has been described with reference to FIG. 12. Therefore, each correlation signal can be obtained promptly.

The system further includes a mark position detecting circuit 174 into which correlation signals obtained at the correlation processing circuit 173 are supplied. The mark position detecting circuit 174 is arranged to detect the position of the center of each correlation signal on the basis of the peak position thereof. Also, the mark position detecting circuit 174 is operable to detect the positional deviation of the thus detected center with respect to the reference position which is predetermined. Namely, the position of the center relative to the predetermined reference position is detected. As a result, the signals which are proportional to the positional errors $\Delta X$, $\Delta Y$ and $\Delta \theta$ of the wafer in the X, Y and $\theta$ directions and with respect to the reference position, can be formed. The signals representing the positional errors in the X, Y and $\theta$ directions are supplied into a control unit 175. In response thereto, the control unit 175 produces a control signal which is applied to the driving means 165. In response, the driving means 165 operates to displace the wafer stage 25 by necessary amounts $\Delta X$, $\Delta Y$ and $\Delta \theta$, whereby the alignment of the wafer 22 with regard to the particular shot area, described hereinbefore, is accomplished.

After completion of the wafer alignment, the circuit pattern of the reticle 21 is transferred in a reduced scale onto that shot area on the wafer 22, by exposure of the same to the light passed through the reticle 21.

Since in the present embodiment, the reference signal is formed in accordance with the detected signal obtained from the alignment mark, it is possible to detect correctly and accurately the position of the center of the detected signal. This is because, in the reference signal forming means 172, such a reference signal whose waveform is similar or analogous to that of the distorted "detected signal" can be produced, so that the correlation processing circuit 173 can conduct the autocorrelation processing.

Where the mark detection is to be executed sequentially to plural marks, the reference signal formed during the detection of a first mark may be used for the detection of a second mark. In such case, the reference signal may be stored in a suitable memory which may be provided in the correlation processing circuit 173.

On the other hand, where a reference signal is formed each time a mark is detected, as in the FIG. 16 embodiment, it is possible to stabilize the mark detection regardless of any change in the waveform of detected signals.

In the embodiment of FIG. 16, the positions of the alignment marks of the reticle 21 and the wafer 22 may be determined so that, when the alignment marks of a particular shot area on the wafer 22 are projected upon the reticle 21 by the projection lens system 162, an image of each wafer alignment mark is formed in the neighborhood of a corresponding one of the reticle alignment marks. In such case, it is possible to dispose the total reflection mirror 166 above the reticle 21. By doing so, the alignment marks of the reticle and the wafer can be detected simultaneously through the detecting means 167, as in the foregoing embodiments.

If the simultaneous detection described above is desired, the reference signal forming circuit 172 may operate to form a first reference signal to be used with the reticle alignment mark signals and a second reference signal to be used with the wafer alignment marks signals. Thus, the first and second formed reference signals may be applied selectively and sequentially to the correlation processing circuit 173, in synchronism with the applying of the signal trains to the correlation processing circuit 173 from the memory 171.

Then, the correlation processing circuit 173 may operate to form, from the signal trains and the first reference signal, a first correlation signal effective to determine the position of the reticle alignment mark, and subsequently the correlation processing circuit 173 may operate to form, from the signal trains and the second reference signal, a second correlation signal effective to determine the position of the wafer alignment mark. The thus obtained correlation signals may be applied in sequence to the mark position detecting circuit 174 and processed therein. The portion of the position detecting sequence, following this, may be the same as the corresponding portion of the sequence described with reference to the foregoing embodiment.

While the invention has been described with reference to the structures disclosed herein, it is not confined to the details set forth and this application is intended to cover such modifications or changes as may come within the purposes of the improvements or the scope of the following claims.

What is claimed is:

1. A method of detecting a mark provided on an object, comprising the steps of:
   forming a signal related to the object;
   detecting an approximate center of the signal related to the object;
   executing correlation processing on the signal related to the object and a reference signal to produce a correlation signal, wherein the correlation processing is made with respect to a range which is about the approximate center of the signal related to the object; and
   detecting the mark on the basis of the correlation signal.

2. A method according to claim 1, wherein the signal related to the object is formed by converting light from the object into an electric signal.

3. A method according to claim 2, wherein the signal related to the object is formed by filtering the electric signal by using a frequency filter.

4. A method according to claim 1, wherein the signal related to the object is formed by converting secondary electrons from the object into an electric signal.

5. A device for detecting a mark provided on an object, comprising:
   first signal forming means for forming a signal related to the object;
   means for detecting the approximate position of a center of the signal as formed by said first signal forming means;
   second signal forming means for executing a correlation processing on the formed signal and a reference signal to produce a correlation signal, the correlation processing being executed based on a range which is about the center of the signal as formed by said first signal forming means and detected by said detecting means; and
   detecting means for detecting the mark on the basis of a peak position of the formed correlation signal.

6. A device according to claim 5, wherein the reference signal is formed on the basis of the signal as formed by said first signal forming means.

7. A device according to claim 6, further comprising means for storing the formed reference signal and wherein the stored reference signal is applied to said second signal forming means upon execution of the correlation processing.

8. A device according to claim 5, wherein the reference signal has a waveform which is analogous to that of the signal formed by said first signal forming means.

9. A device according to claim 5, wherein said first signal forming means includes means for forming an electric signal and filtering means for filtering the electric signal with respect to frequency, to provide a signal related to the object.

10. A device according to claim 9, wherein said filtering means comprises a band-pass filter.

11. A method of detecting the relative position of a first mark provided on a first object and a second mark provided on a second object, comprising the steps of:
   forming a signal related to the first object and the second object;
   setting a first reference signal for detection of the first mark and executing a first correlation processing on the formed signal and the first reference signal to produce a first correlation signal;
   setting a second reference signal, different from the first reference signal, for detection of the second mark and executing a second correlation processing on the formed signal and the second reference signal to produce a second correlation signal; and
   detecting the relative position of the first and second marks on the basis of the produced first and second correlation signals.

* * * * *

UNITED STATES PATENT AND TRADEMARK OFFICE
CERTIFICATE OF CORRECTION

PATENT NO. : 4,971,444

DATED : November 20, 1990

INVENTOR(S) : YUZO KATO

It is certified that error appears in the above-identified patent and that said Letters Patent is hereby corrected as shown below:

ON THE TITLE PAGE,
IN [57] ABSTRACT

Line 3, "wtih" should read --with--.

COLUMN 2

Line 31, "direction(X" should read --directions (X--.
   Line 68, "are" should read --is--.

COLUMN 3

Line 26, "of on" should read --on the--.

COLUMN 5

Line 36, "or" (first occurrence) should be deleted.

COLUMN 9

Line 11, "equation:" should read --equations:--.

COLUMN 10

Line 11, "be detect" should read --detect,--.
   Line 30, "obtained Then" should read --obtained. Then--.
   Line 32, "detected This" should read --detected. This--.

COLUMN 13

Line 30, "function If," should read --function. If,--.

UNITED STATES PATENT AND TRADEMARK OFFICE
CERTIFICATE OF CORRECTION

PATENT NO. : 4,971,444

DATED : November 20, 1990

INVENTOR(S) : YUZO KATO

It is certified that error appears in the above-identified patent and that said Letters Patent is hereby corrected as shown below:

COLUMN 16

Line 36, "numeral 150" should read --numeral 151--.

COLUMN 17

Line 12, "includes" should read --include--.
    Line 43, "is" should read --are--.

COLUMN 19

Line 30, "marks" should read --mark--.

Signed and Sealed this

Eighth Day of September, 1992

Attest:

DOUGLAS B. COMER

*Attesting Officer*     *Acting Commissioner of Patents and Trademarks*